United States Patent
Chou et al.

(10) Patent No.: US 6,709,285 B1
(45) Date of Patent: Mar. 23, 2004

(54) ELECTRIC CONNECTING ELEMENTS FOR PIEZOELECTRIC PLATES

(75) Inventors: Chin-Wen Chou, Hsin-Tien (TW); Eddie Cheng, Hsin-Tien (TW)

(73) Assignee: Shin Jiuh Corp., Taipei (TW)

( * ) Notice: Subject to any disclaimer, the term of this patent is extended or adjusted under 35 U.S.C. 154(b) by 0 days.

(21) Appl. No.: 10/352,935

(22) Filed: Jan. 29, 2003

(51) Int. Cl.[7] .............................................. H01R 12/00
(52) U.S. Cl. ........................ 439/500; 439/73; 310/348; 310/354
(58) Field of Search ........................... 439/65, 68, 69, 439/70, 71, 73, 567, 78, 84, 500; 310/348, 354, 365, 353; 361/768, 769, 770

(56) References Cited

U.S. PATENT DOCUMENTS

| | | | | |
|---|---|---|---|---|
| 4,273,399 A | * | 6/1981 | Myers et al. | 439/74 |
| 4,864,259 A | * | 9/1989 | Takamoro et al. | 333/189 |
| 5,091,671 A | * | 2/1992 | Yoshida | 310/358 |
| 5,096,425 A | * | 3/1992 | Takahashi | 439/55 |
| 5,213,513 A | * | 5/1993 | Brown et al. | 439/68 |
| 5,345,136 A | * | 9/1994 | Takagi et al. | 310/320 |
| 5,383,794 A | * | 1/1995 | Davis et al. | 439/352 |
| 5,850,677 A | * | 12/1998 | Ryoichi | 29/25.35 |
| 5,949,179 A | * | 9/1999 | Kumasaka et al. | 310/348 |
| 6,146,182 A | * | 11/2000 | Wang et al. | 439/357 |
| 6,307,305 B1 | * | 10/2001 | Yoshio et al. | 310/348 |
| 6,315,577 B1 | * | 11/2001 | Kugo | 439/72 |
| 6,472,798 B2 | * | 10/2002 | Kishimoto | 310/344 |

* cited by examiner

*Primary Examiner*—Gary Paumen
*Assistant Examiner*—X. Chung-Trans
(74) *Attorney, Agent, or Firm*—Birch, Stewart, Kolasch & Birch, LLP

(57) ABSTRACT

An improved electric connecting element for piezoelectric plates has an elastic section connecting to an electric connection spot of a piezoelectric plate. The elastic section has one end extending to form a latch section to fasten to a circuit board and another end extending upwards above the piezoelectric plate to form a retaining section to constrain the piezoelectric plate from being shaken loose. Thereby the piezoelectric plate has a better electric connection and can be prevented from escaping under excessive shaking.

17 Claims, 6 Drawing Sheets

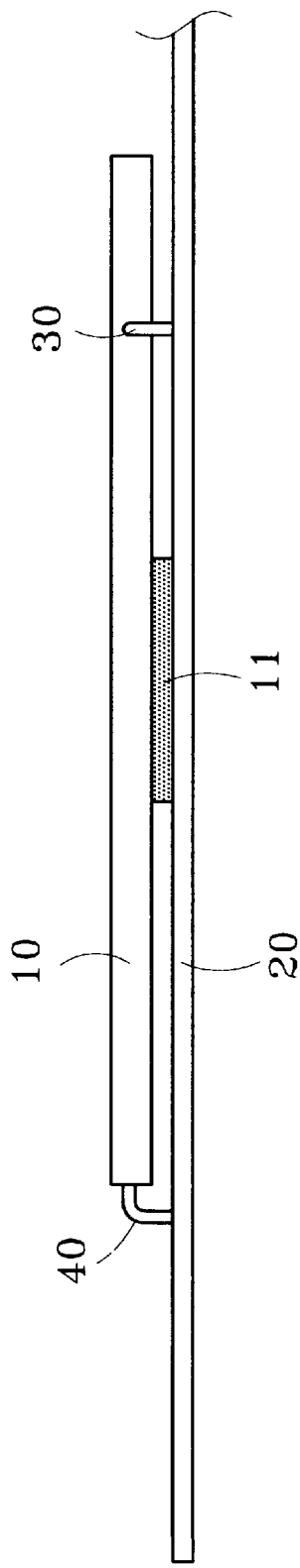
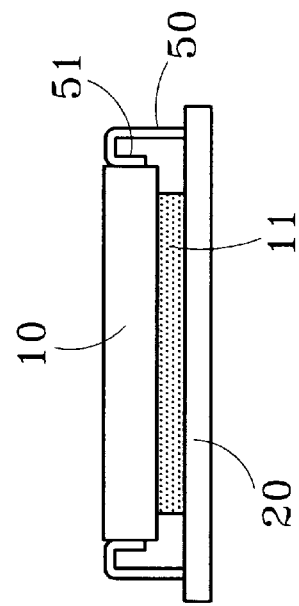
Fig.1 PRIOR ART
Fig.2 PRIOR ART

ELECTRIC CONNECTING ELEMENTS FOR PIEZOELECTRIC PLATES

FIELD OF THE INVENTION

The present invention relates to an improved electric connecting element for piezoelectric plates and particularly to an electric connecting element adopted for use on an input end of the piezoelectric plates to facilitate installation and achieve good electric connection.

BACKGROUND OF THE INVENTION

At present the methods of establishing electric connection between a piezoelectric plate 10 and a circuit board 20 can be grouped in the following types:

FIG. 1 illustrates one type of electric connection in which the connection spot 12 for either the high voltage output end or the power supply input end of the piezoelectric plate 10 is directly soldered through a leg 30 or 40. As the piezoelectric plate 10 is subject to shaking when conductive, especially the shaking of transverse frequency, the legs 30 and 40 are prone to fracture. Moreover, connection done entirely by soldering is a tedious and troublesome operation. The space required for shaking is restrictive and limits its performance.

FIG. 2 shows another type of electric connection. It mainly has the legs 30 and 40 bent to form integrated electric connection plates 50. Each connection plate 50 is bent to form an elastic section 51 corresponding to the electric connection spot 12. For installation, the piezoelectric plate 10 is wedged in and the elastic section 51 provides an elastic force to anchor the piezoelectric plate 10 to establish electric connection. The elastic force of the elastic section 51 also provides a desired shaking space for the piezoelectric plate 10 to maintain its effectiveness. However, shaking of the piezoelectric plate 10 may occur in the longitudinal direction in addition to the transverse direction. Clipping by the smooth surface of the elastic section 51, the piezoelectric plate 10 is easy to get loose or break away under excessive shaking. To remedy this drawback, some tries to shorten the distance between the elastic sections 51 of the two connection plates 50. But such an approach creates a risk of fracturing the fragile piezoelectric plate 10. Moreover, such a design also is dubious in terms of practicality.

FIG. 3 depicts yet another type of electric connection that has a housing box 60 to hold the piezoelectric plate 10. It has a plurality of legs 61 connecting to the piezoelectric plate 10 and a plurality of cushion units 62 coupling with the legs 61 to constrain the piezoelectric plate 10. As the piezoelectric plate 10 is located in the housing box 60 and connected to the legs 61 and retained by the cushion units 62, the shaking generated by the piezoelectric plate 10 may be absorbed and eliminated by the cushion units 62, and the legs 61 may be prevented from fracturing. While such a design can resolve most of the problems occurred in applications, the housing box 60 and its lid 70 take a greater amount of space. It does fit very well for electronic products that demand a smaller size.

SUMMARY OF THE INVENTION

Therefore the primary object of the invention is to resolve the aforesaid disadvantages. The invention provides an improved electric connecting element that has an elastic section connecting to an electric connection spot of the input end of a piezoelectric plate. The elastic section has one end extended to form an anchor section to fasten to a circuit board and another end extended upwards above the piezoelectric plate to form a retaining section to prevent the piezoelectric plate from shaking loose from the electric connection spot of the piezoelectric plate. Thus the piezoelectric plate may have a better electric connection and also may be held securely without breaking away under excessive shaking.

The foregoing, as well as additional objects, features and advantages of the invention will be more readily apparent from the following detailed description, which proceeds with reference to the accompanying drawings, which are given by way of illustration only, and thus are not limitative of the present invention.

BRIEF DESCRIPTION OF THE DRAWINGS

FIG. 1 is a schematic view of a first conventional electric connection for a piezoelectric plate.

FIG. 2 is a schematic view of a second conventional electric connection for a piezoelectric plate.

DESCRIPTION OF THE PREFERRED EMBODIMENT

Figure 3:
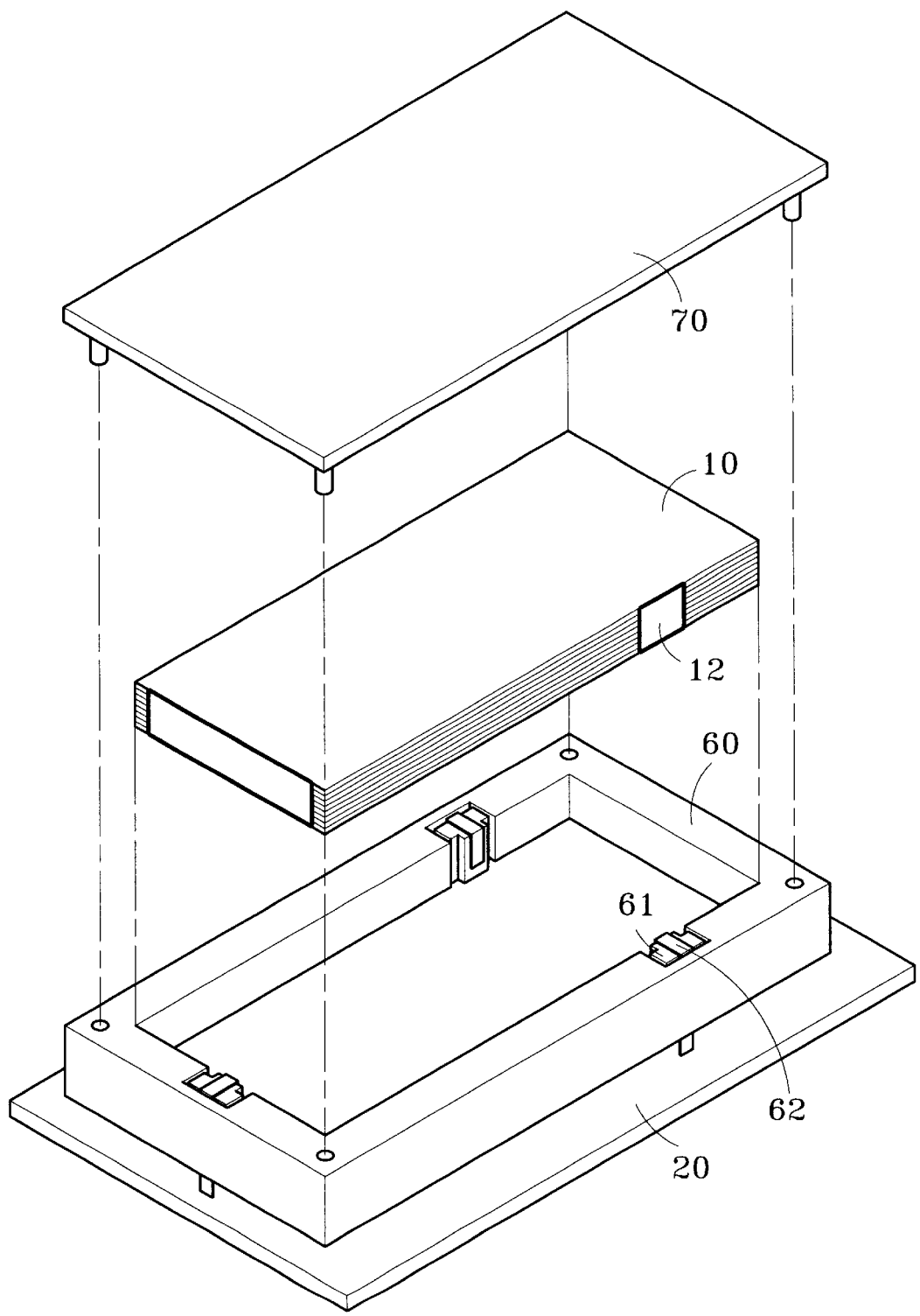
FIG. 3 is a schematic view of a third conventional electric connection for a piezoelectric plate.
Figure 4:
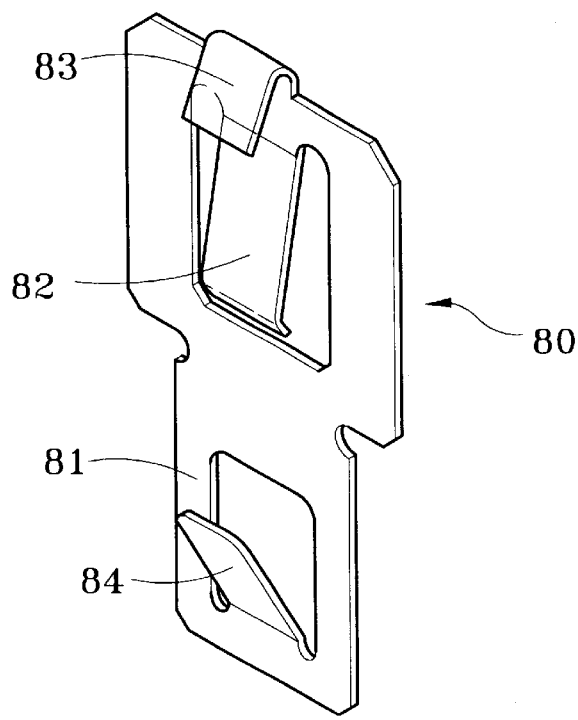
FIG. 4 is a perspective view of the electric connecting element of the invention.
Figure 6:
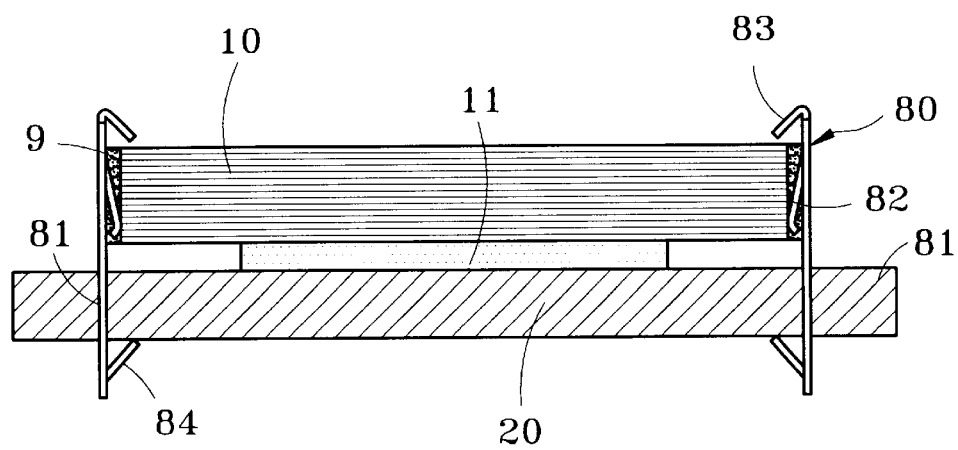
FIG. 6 is a side view of the invention showing the piezoelectric plate being electrically connected.
Figure 5:
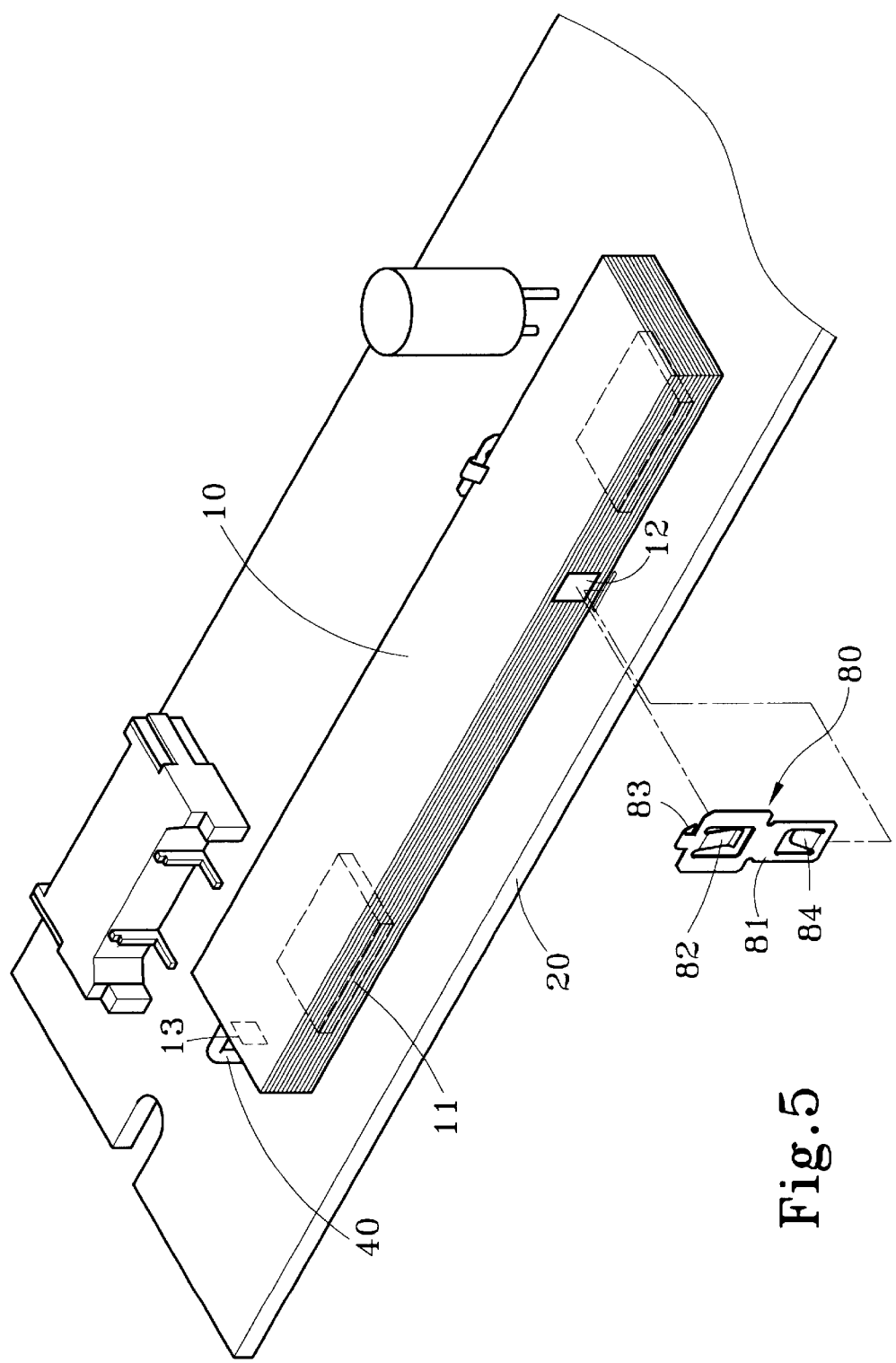
FIG. 5 is a schematic view of the electric connecting element of the invention in an installed condition.

Referring to FIGS. 4, 5, 6 and 8, the electric connecting elements 80 and 80' of the invention are located on electric connection spots 12 and 13 of a piezoelectric plate 10. The connection spot 13 is located on the output end of the piezoelectric plate 10 and may be soldered on a circuit board 20 through a leg 40. The connecting elements 80 and 80' have respectively an elastic section 82 and 82' connecting to the electric connection spots 12 and 13. The elastic sections 82 and 82' are integrally formed by punching. The elastic sections 82 and 82' have one end extended to form an anchor section 81 and 81' to fasten to the circuit board 20. The anchor sections 81 and 81' have respectively a latch section 84 and 84' to latch on the bottom section of the circuit board 20 for anchoring. The latch sections 84 and 84' are integrally formed by punching and are elastic. The elastic sections 82 and 82' have another end extended upwards above the piezoelectric plate 10 to form respectively a retaining section 83 and 83' to constrain the piezoelectric plate 10 from shaking loose.

For installation, directly insert the anchor sections 81 and 81' of the electric connecting elements 80 and 80' into the electric connection spots 12 and 13 of the piezoelectric plate 10, and pass through the bottom section of the circuit board 20 until the elastic latch sections 84 and 84' of the anchor sections 81 and 81' latching on the bottom section of the circuit board 20. Thereby the electric connecting elements 80 and 80' are anchored on the circuit board 20. Then wedge the piezoelectric plate 10 between the electric connecting elements 80 and 80'. As the retaining sections 83 and 83' also are formed by bending and have elasticity, the piezoelectric plate 10 may be depressed to pass through the retaining sections 83 and 83'. Once being wedged between the electric connection spots 12 and 13, the elastic sections 82 and 82' provide an elastic force to compress the electric connection spots 12 and 13 to anchor the piezoelectric plate 10. Moreover, there is an elastic element 11 located between the piezoelectric plate 10 and the circuit board 20 to maintain a selected interval. When the piezoelectric plate 10 is in contact with the elastic element 11, it is completely fallen below the retaining sections 83 and 83'. Thus the retaining sections 83 and 83' form a space thereabove by their restoring force that is slightly smaller than the width of the piezoelectric plate 10.

Figure 7:
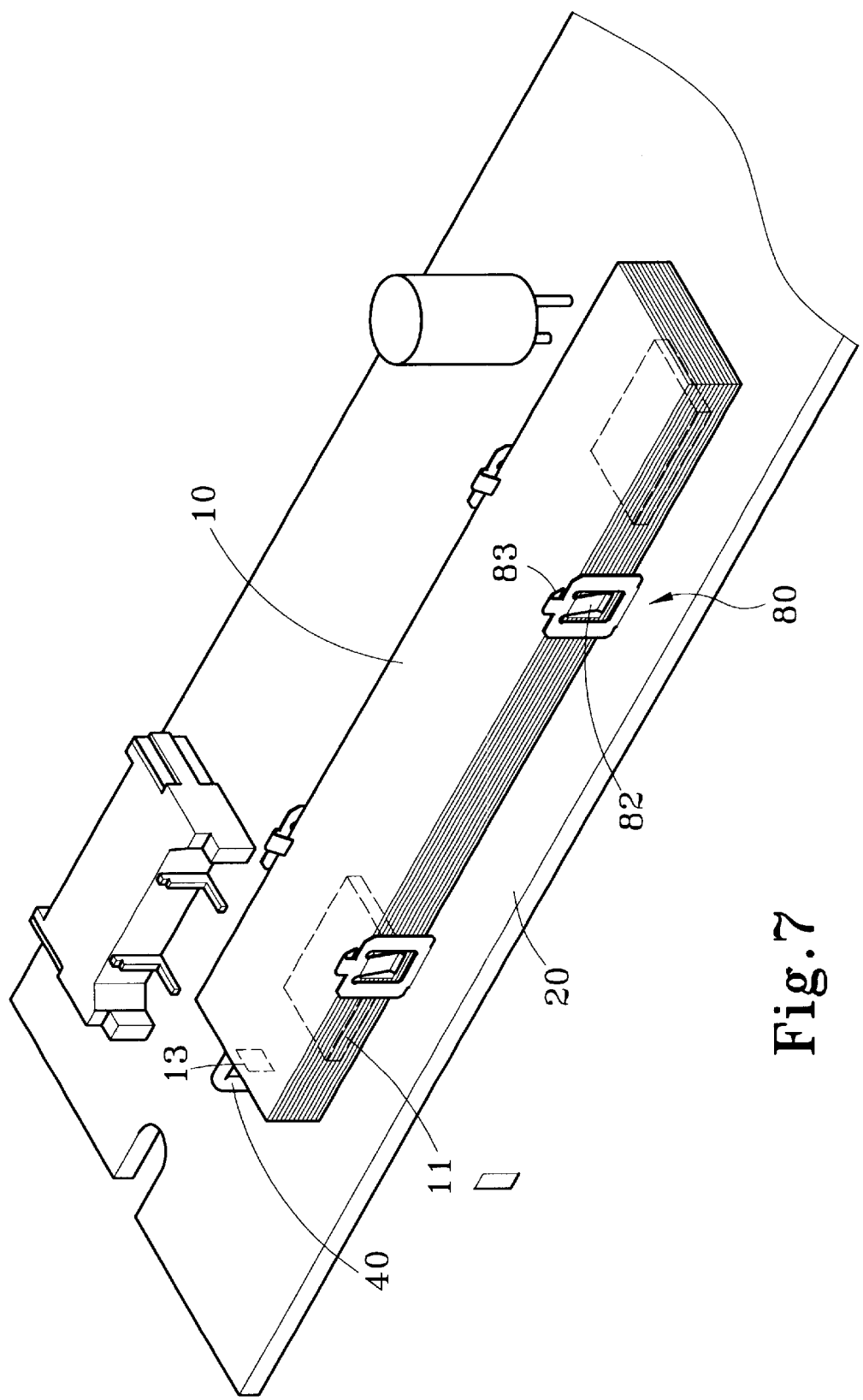
FIG. 7 is a schematic view of the invention in a use condition.
Figure 8:
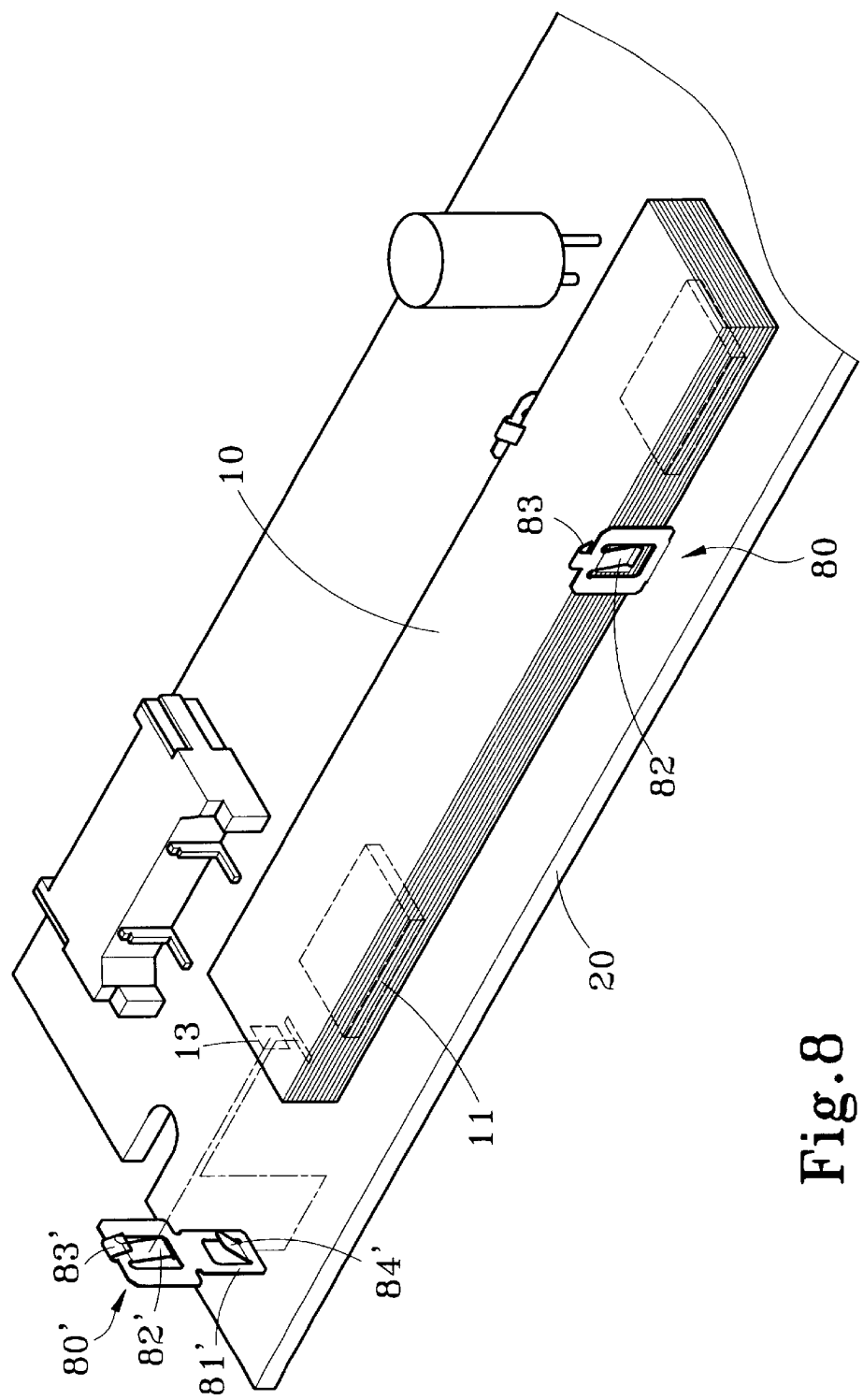
FIG. 8 is a schematic view of the invention in another use condition.

When the piezoelectric plate 10 is conductive and shakes, considering the output end will generate sparks and noise due to shaking, the electric connecting element 80 may be disposed on the electric connection spot 12 at the input end of the piezoelectric plate 10, while the electric connection spot 13 at the high voltage output end may be soldered through the leg 40 for anchoring. In addition, as shown in FIG. 7, the electric connecting elements 80 and 80' may also be disposed around the piezoelectric plate 10 other than the electric connection spot 12 at the input end and the electric connection spot 13 at the high voltage output end to provide multiple supporting and anchoring effect. When the piezoelectric plate 10 starts shaking, the elastic force of the elastic sections 82 and 82' provides transverse cushion for the piezoelectric plate 10 to ensure that the piezoelectric plate 10 does not escape from the electric connection spot 12 at the input end and does not affect the performance. The shaking in the longitudinal direction can also be constrained as a smaller space is formed above the piezoelectric plate 10 due to the retaining sections 83 and 83', thus the piezoelectric plate 10 may be held securely without escaping under excessive shaking.

Furthermore, after the elastic sections 82 and 82' of the electric connecting elements 80 and 80' are wedged and anchored on the electric connection spots 12 and 13, a conductive paste 9 may be planted on the contact location of the electric connecting elements 80 and 80' and the piezoelectric plate 10. As the conductive paste 9 has a great tensile strength and excellent electric and thermal conductivity, it can reinforce the anchoring effect at the contact locations of the electric connecting elements 80 and 80' and the piezoelectric plate 10 and prevent poor electric conductivity that might otherwise occur resulting from friction between the electric connecting elements 80 and 80' and the piezoelectric plate 10. Moreover, the conductive paste 9 planted between the electric connecting elements 80 and 80' and the piezoelectric plate 10 can prevent oxidation at the electric contacts that might otherwise destroy the conductivity of the piezoelectric plate 10.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An electric connecting element for piezoelectric plates located between a piezoelectric plate and an electric connection spot for installation on a circuit board, comprising:

an elastic section connectable to the electric connection spot;

an anchor section extending from one end of the elastic section to fasten to the circuit board;

a latch section located on the anchor section for latching on a bottom section of the circuit board, the latch section extending upwardly from the anchor section at an angle; and a retaining section extending from another end of the elastic section above the piezoelectric plate to constrain the piezoelectric plate from being shaken loose.

2. The electric connecting element for piezoelectric plates of claim 1, wherein the piezoelectric plate has an electric connection spot at an output end therefore that is anchored through a leg by soldering.

3. The electric connecting element for piezoelectric plates of claim 1, further comprising an elastic element for spacing the piezoelectric plate form the circuit board at a selected distance.

4. The electric connecting element for piezoelectric plates of claim 1, wherein the electric connecting element is disposed around the piezoelectric plate on a location other than the electric connection spot.

5. The electric connecting element for piezoelectric plates of claim 1, wherein the elastic section is integrally formed by punching.

6. The electric connecting element for piezoelectric plates of claim 5, wherein the elastic section is a one-piece structure with the anchor section.

7. The electric connecting element for piezoelectric plates of claim 1, wherein the latch section is integrally formed by punching.

8. The electric connecting element for piezoelectric plates of claim 7, wherein the latch section is a one-piece structure with the anchor section.

9. The electric connecting element for piezoelectric plates of claim 1, wherein the latch section is elastic.

10. The electric connecting element for piezoelectric plates of claim 1, further comprising a conductive paste planting on the contact location between the electric connecting element and the piezoelectric plate after the elastic section of the electric connecting element is anchored on the electric connector spot under the compression of an elastic force to anchor the piezoelectric plate and prevent the elastic section from oxidizing.

11. The electric connecting element for piezoelectric plates of claim 1, wherein the latch section, the elastic section, and the anchor section are a one-piece structure.

12. The electric connecting element for piezoelectric plates of claim 1, wherein the latch section, the elastic section, the retaining section and the anchor section are a one-piece structure.

13. The electric connecting element for piezoelectric plates of claim 1, wherein the elastic section and the latch section extend away from the anchor section on a same side of the anchor section.

14. The electric connecting element for piezoelectric plates of claim 1, wherein the elastic section is between the retaining section and the latch section and wherein the elastic section, the retaining section and the latch section extend away from the anchor section on a same side of the anchor section.

15. The electric connecting element for piezoelectric plates of claim 1, wherein the anchor section is flat.

16. The electric connecting element for piezoelectric plates of claim 1, wherein when the retaining section is in engagement with the piezoelectric plate, the retaining section only engages a top of the piezoelectric plate.

17. The electric connecting element for piezoelectric plates of claim 1, wherein the latch section forms a tab which extends from the anchor section and is snap-fit to engage with and latch the circuit board.

\* \* \* \* \*